(12) United States Patent
Janssen et al.

(10) Patent No.: US 9,961,778 B2
(45) Date of Patent: May 1, 2018

(54) LIQUID IMMERSION TRANSFER OF ELECTRONICS

(71) Applicant: PHILIPS LIGHTING HOLDING B.V., Eindhoven (NL)

(72) Inventors: Esther Anna Wilhelmina Gerarda Janssen, Waalre (NL); Marc Andre De Samber, Lommel (BE); Eric Cornelis Egbertus Van Grunsven, Someren (NL); Egbertus Reinier Jacobs, Overloon (NL)

(73) Assignee: PHILIPS LIGHTING HOLDING B.V., Eindhoven (NL)

(*) Notice: Subject to any disclaimer, the term of this patent is extended or adjusted under 35 U.S.C. 154(b) by 101 days.

(21) Appl. No.: 14/982,038

(22) Filed: Dec. 29, 2015

(65) Prior Publication Data
US 2016/0198577 A1    Jul. 7, 2016

(30) Foreign Application Priority Data
Jan. 6, 2015 (EP) .................................... 15150161

(51) Int. Cl.
| | |
|---|---|
| H05K 3/00 | (2006.01) |
| B44C 1/175 | (2006.01) |
| H05K 1/02 | (2006.01) |
| H05K 1/18 | (2006.01) |
| F21K 9/90 | (2016.01) |
| F21Y 115/10 | (2016.01) |
| F21Y 107/00 | (2016.01) |

(52) U.S. Cl.
CPC .......... *H05K 3/007* (2013.01); *B44C 1/1758* (2013.01); *H05K 1/0284* (2013.01); *H05K 1/181* (2013.01); *H05K 3/0058* (2013.01); *F21K 9/90* (2013.01); *F21Y 2107/00* (2016.08); *F21Y 2115/10* (2016.08); *H05K 1/189* (2013.01); *H05K 2201/09018* (2013.01); *H05K 2201/10106* (2013.01); *Y02P 70/611* (2015.11)

(58) Field of Classification Search
USPC ......................................... 427/58, 97.1, 98.4
See application file for complete search history.

(56) References Cited

U.S. PATENT DOCUMENTS

| | | | | |
|---|---|---|---|---|
| 2,785,280 A | * | 3/1957 | Eisler | B23H 1/00 216/6 |
| 3,006,795 A | * | 10/1961 | Brickell | B41M 3/12 216/36 |

(Continued)

FOREIGN PATENT DOCUMENTS

| | | |
|---|---|---|
| EP | 2495109 | 9/2012 |
| JP | S6444797 A | 2/1989 |

(Continued)

*Primary Examiner* — Brian K Talbot

(57) ABSTRACT

A liquid immersion transfer process for applying electronics on a 3D object and a system is disclosed. In one embodiment, the process comprises providing a foil on a solid carrier in a foil provision stage, providing electronic wiring and an electronic component to the foil in an electronics provision stage, to provide said electronics, removing the solid carrier and arranging the foil on or in a liquid in a liquid application stage, and transferring the electronics to the 3D object in a transfer stage, as well as a 3D object obtainable by such process.

13 Claims, 2 Drawing Sheets

(56) References Cited

U.S. PATENT DOCUMENTS

| | | | | |
|---|---|---|---|---|
| 3,950,200 | A | * | 4/1976 | Muramoto ............... B41J 2/345 |
| | | | | 101/31 |
| RE29,820 | E | * | 10/1978 | Konicek ................. C25D 3/38 |
| | | | | 156/151 |
| 4,415,607 | A | * | 11/1983 | Denes .................... H05K 1/167 |
| | | | | 156/230 |
| 8,921,473 | B1 | | 12/2014 | Hyman |
| 2010/0151122 | A1 | | 6/2010 | Chen et al. |
| 2012/0227769 | A1 | * | 9/2012 | Yoshii .................... B44C 1/175 |
| | | | | 134/34 |
| 2013/0036928 | A1 | * | 2/2013 | Rogers ................... B41J 2/475 |
| | | | | 101/483 |
| 2014/0257518 | A1 | * | 9/2014 | McAlpine ............... A61L 27/14 |
| | | | | 623/24 |

FOREIGN PATENT DOCUMENTS

| | | | |
|---|---|---|---|
| JP | 2004214502 | A | 7/2004 |
| JP | 2010267607 | A | 11/2010 |
| JP | 2011086614 | | 4/2011 |
| JP | 2012248332 | A | 12/2012 |
| JP | 2013143079 | A | 7/2013 |
| JP | 2016060089 | A | 4/2016 |
| WO | WO2009131091 | A1 | 10/2009 |
| WO | 2011052636 | A1 | 5/2011 |

* cited by examiner

LIQUID IMMERSION TRANSFER OF ELECTRONICS

CROSS REFERENCE TO RELATED APPLICATIONS

This application claims the benefit of European Patent Application Number 15150161.6 filed Jan. 6, 2015, which is incorporated herein by reference.

TECHNICAL FIELD

The invention relates to a liquid immersion transfer process, to a 3D object to which the liquid immersion transfer process has been applied, as well as to a system for such a liquid immersion transfer process.

BACKGROUND

Methods to integrate electronics with 3D objects are known in the art. US 2014/0257518, which is incorporated by reference, describes for instance a bioelectronic device and a method of making of such a device. The device of US 2014/0257518 includes a scaffold formed via 3D (3-dimensional) printing. The device also includes a biologic and an electronic device formed via 3D printing, with the biologic and electronic device being interwoven with or coupled to the scaffold. The electronic component may, e.g., include at least one of hard conductors, soft conductors, insulators and semiconductors. The scaffold may be formed of at least one of synthetic polymers and natural biological polymers. The biologic may include at least one of animal cells, plant cells, cellular organelles, proteins and DNA (including RNA).

LEDs are realizing a revolution in the world of lighting. Technology is no longer restricted to glass bulbs and tubes with standard fixtures. LEDs are very small and can be combined or even embedded in all sorts of materials: glass, silicone, wood, plastic, or textile. This opens up a whole new world for lighting designers. Organic shaped luminaires for example are very appealing products. Therefore methods are looked for that allow populating large and organic shaped objects with LEDs.

Traditionally LEDs, like other semiconductor dies, are assembled by automatic pick and place equipment on planar 2D printed circuit boards. These circuit boards can be rigid or flexible. Flexible printed circuit boards, like linear LED strips, are assembled in 2D but can be bent and twisted to a certain extent afterwards. This has already opened up a large number of new lighting applications.

Products with a sort of 3D lighting appearance can be made by inserting, for example, LED strips inside a transparent 3D shape in combination with light guides. This method is restricted by the bending ability of the strip, the pitch of the LEDs on the strip and the optical design and efficiency of the light guides.

More advanced 3D electronic lighting devices can be made by moulded interconnect device (MID) technologies. In such technologies, conductive tracks are formed on a product moulded with a dedicated polymer material. It allows LEDs to be placed in any angle and direction. However, a non-pick-and-place solution is preferred for use on odd shaped surfaces, as populating such surfaces with electronics would require having a large degree of freedom manipulation of the receiving carrier substrate or an 'any angle' place tool, which is an expensive solution. An example of electronics that can be used is OLEDs. Flexible OLEDs hold the promise of being able to provide a free form emissive shape, but these are still in early development.

Hence, there is an interest in providing electrical components such as LEDs, but also other electrical components like sensors, solar cells, etc., to (complex shaped) 3D objects. However, technologies presently known often have a suboptimal compromise between flexibility, electrical power, simplicity of the technology, complexity of the 3D object that can be generated/processed, etc.

SUMMARY

Hence, it is an aspect of the invention to provide an alternative process for applying electronics to a 3D object which preferably further at least partly obviates one or more of above-described drawbacks. It is also an aspect of the invention to provide an alternative apparatus that can be used for such process for applying electronics to a 3D object which preferably further at least partly obviates one or more of above-described drawbacks. Yet, it is a further aspect of the invention to provide an alternative 3D object, e.g. obtainable with such (alternative) process, and which preferably further at least partly obviates one or more of above-described drawbacks.

In this invention we suggest—amongst others—a method for realizing a 3D shaped electronic device with e.g. inorganic LEDs based emitting surface. It is our aim to use the method of immersion technology to the transfer of pre-fabricated planar assemblies (make use of various existing or modified substrate fabrication and component P&P ("pick-and-place") methods). The pre-fabricated planar geometries may substantially comply with the envisioned 3D final structure of the application. This invention may enable cost-effective fabrication of real 3D shaped electronic devices, by using standard planar 2D circuitry and assembly technologies. Using e.g. LEDs as light sources allows a large flexibility in light color, light output (light flux), component choice (along development roadmaps), which would not be the case for an OLED solution. Also we suggest herein—amongst others—a fully digitally mastered method of manufacturing, making in a very flexible and personalized way electrical circuitry composed of e.g. LED package, non-lighting electronic components, passive electric components, and conductor tracks, etc., and allowing the creation of various end products (diversity) from a minimal number of building elements. This will enable cost-effective fabrication of small series of personalized lighting products. Such method or process is called here (a) 'hybrid additive manufacturing' (process).

Liquid immersion transfer is also known as water transfer printing, hydrographic printing, hydrographic technology, immersion printing, water transfer printing, water transfer imaging, cubic printing, etc. It is a method of applying printed designs to a three-dimensional (3D) surface. The hydrographic process can be used on metal, plastic, fiberglass, glass, (hard) wood, ceramics, and various other materials. However, other materials, even from biological or human origin, may also be applied. Liquid immersion transfer is also commonly known as "hydro dipping" due to the fact that the parts are dipped in water. However, also other liquids may in principle be applied. Hence, the invention is not limited to a transfer process using water as liquid. The "liquid" is herein also indicated as "transfer liquid".

Amongst others, EP2495109 describes that the water transfer printing process is extensively used to decorate all kind of items. Films can be applied to all types of substrates. For the most part, if the item can be dipped in water and can be painted using traditional techniques then the hydrographic printing process can be used. A liquid pressure transfer is known, in which a transfer film made by applying an appropriate water-insoluble transfer pattern with transfer ink on a water-soluble film (holding sheet) in advance is set in the transfer tank (transfer liquid) so that the transfer film floats on the transfer liquid, and, while the transfer film (water-soluble film) is wet with the transfer liquid (in short, water), the object is pressed onto the liquid in the transfer tank while the object is brought into contact with the transfer film, and using the liquid pressure, the transfer pattern on the film is transferred and formed on the surface of the object. As described above, on the transfer film, the transfer pattern is formed (printed) on the water-soluble film with ink in advance, and the ink of the transfer pattern is in a dried state. Therefore, during the transfer, it is necessary to apply an activating agent, a thinner, and the like to the transfer pattern on the transfer film to return the transfer pattern back to a wet state like the state immediately after the printing of the transfer pattern, i.e., to return the transfer pattern back to a state achieving the adhesive property, and this is referred to as activation. Then, after the transfer, the half-dissolved water-soluble film is removed by water-cleaning and the like from the object removed from the transfer tank, and thereafter, the object is dried. In order to protect the decorative layer formed and transferred onto the object, the object is subjected to top coating in many cases.

In above paragraph, an embodiment of a general immersion transfer process is described. Elements thereof can be used in the presently described process, but may also be modified.

As indicated above, herein we suggest using the liquid immersion transfer process to apply electronic components to surfaces, especially to complex surfaces like curved surfaces.

In a first aspect, the invention provides a liquid immersion transfer process for applying one or more of electronic wiring and an electronic component on a 3D object (part), the process comprising:

providing a foil (herein also indicated as "transfer film"), especially a foil on a solid carrier, in a foil provision stage;

providing one or more of electronic wiring ("conductor tracks") and an electronic component, especially both electronic wiring and an electronic component, to the foil in an electronics provision stage, to provide said electronics;

removing the (optional) solid carrier and arranging the foil on or in a liquid in a liquid application stage;

transferring the one or more of electronic wiring and an electronic component to the 3D object, especially by at least a partial immersion of the 3D object in the liquid, in a transfer stage.

It surprisingly appears that the present process provides advantages in terms of flexibility, electrical power, simplicity of the technology, and the complexity of the 3D object that can be generated/processed. Other technologies that were considered, such as film insert molding, 3D printing and folding, using paper circuits, using stretchable substrates, using thin fools, or V-cutting PCBs, etc., might be better in one of these aspects, but appear to be worse in other aspects (at least for the present objects). The presently provided process, however, provides a surprising good compromise between two or more of the indicated desired features of flexibility, electrical power, simplicity of the technology, and the complexity of the 3D object that can be used or created.

The 3D object can in principle be any object. Part of the object, or the entire object, may be submerged in the liquid. It is that part of the object to which the electronic wiring and/or electronic components are transferred (which will at least partly, or even entirely, be submerged (i.e. immersed)). This part of the object, herein also indicated as object part, may be flat or curved. The object part may include one or more curvatures; it may be "odd-shaped". Applying electronics to an essentially flat surface may be done with several methods; the process of the invention is especially of substantial competitive advantage when electronics (and a printed design) have to be applied to non-flat objects. However, the invention is not limited to application to non-flat 3D object parts. Hence, especially the 3D object comprises a non-flat 3D object part, which may comprise one or more curvatures. The 3D object, or especially the 3D object part, may have a complex shape.

The 3D object may be an artistic object, with no specific use function (except for the electronics (to be applied)), it may be a functional object having artistic elements, or it may be a substantial functional object. Examples of (functional) 3D objects are e.g. a helmet, a dashboard, a piece of furniture (desk, table, chair, cupboard, etc.), a tool, a household apparatus, a toy, a lampshade, a smart phone cover, a lighting luminaire, a lighting device to mount to the wall or the ceiling, a medical device, a wearable (such as clothes, shoes, boots, etc.), a wearable device (i.e. a device for a wearable (examples of wearables devices are e.g. watches, glasses, contact lenses, e-textiles and smart fabrics, headbands, beanies and caps, jewelry such as rings, bracelets, and hearing aid-like devices that are designed to look like earrings)), etc. Such a 3D object part may include e.g. a curvature in one direction or curvatures in two directions. In addition or alternatively, the 3D object part may include two or more faces arranged at angles with respect to each other (the angles being not equal to) 180°. The person skilled in the art will understand what kind of 3D objects may be suitable for the liquid immersion transfer process. As indicated above, the invention is not limited to the application to 3D objects having a non-flat 3D object part; i.e. the invention may also be applied to a flat 3D object (part).

The phrase "applying one or more of electronic wiring and an electronic component on a 3D object" especially indicates that one or more of electronic wiring and an electronic component may be applied on a 3D object part. Herein, the term "electronics" especially refers to at least an active electronic component. Further, the term electronics may optionally also include wiring (to electrically connect such an electronic component). Hence, the term "electronics" herein may refer to electronic wiring and an electronic component, but especially refers to at least an electronic component. Further, the term "electronics" may in an embodiment also refer to an electrical circuit (including an (active) electrical component).

The present invention is especially directed to provide an active electronic component to the 3D object (part), such as a solid state light source, a sensor, an electronic solar cell. However, the present invention may also be used to apply only electronic wiring to the 3D object and/or passive electronic components such as an electronic touch button (though such elements may also optionally comprise active elements such as a solid state light source to indicate the button and/or to indicate the status of the button or system; or a sensor to sense a touch, etc.). Hence, in an embodiment (of the liquid immersion transfer process or 3D object, etc.), the electronic component comprises one or more of a solid state light source, a sensor, an electronic solar cell, an electronic touch button, a footprint for a battery, a solid state power storage device (e.g. super-capacitor), an electrical interface (connector), a passive component such as a resistor, an inductor, a capacitors, etc. The term "electronic component" may in an embodiment also include a plurality of (different) electronic components. Further, the term "electronic wiring" may refer to a single electronic wire or a plurality of electronic wires. The term "electronics" may e.g. refer to a combination of one set of one or more electronic components and electronic wiring, which are functionally coupled, but may also refer to a plurality of such sets, wherein the sets may or may not functionally be coupled. For instance, a 3D object with two independent light sources and electronic circuits may be provided.

The electronics herein may not necessarily be part of a closed circuit. For instance, the power source may be integrated in the 3D object before or after the present process is applied. Further, the power source and the electronics may be physically coupled to a power source, such as via connectors (and then form a circuit). However, alternatively or additionally the electronics may be powered via inductive power transfer. In the latter embodiment, the electronics may comprise a closed circuit, especially also comprising a device that can be charged inductively, such as a charging coil (as known to a person skilled in the art). Other ways of wireless charging may also be applied, such as capacitive charging. Hence, the electronics may be configured to be charged via a physical contact with an electric power source or via wireless contact with an electrical (wireless) power source. Hence, in an embodiment the 3D object may further optionally comprise two or more connectors for electronically connecting the electronics to a power source. Alternatively or additionally, the electronics may include such a device that can be charged wireless, such as e.g. a charging coil.

As indicated above, in a foil provision stage a foil, especially a foil on a solid carrier ("support"), is provided. In general, the foil is a relatively thin layer that can be dissolved in the liquid in the liquid application stage. The solid carrier may be used to support the foil, e.g. during the stage of applying the electronics and/or when applying a printed design.

As known in the art, the solid carrier and foil are in general applied in such a way, that the solid carrier may be removed relatively easily. The foil is especially at least partially, more especially entirely, soluble in the liquid. Hence, the material of the foil and the liquid may be chosen such that the foil has a suitable foil function, such as receiving one or more of a printed design, the electronic wiring, and the electronic component. As liquid, e.g. water may be applied. More in general, the liquid comprises especially an aqueous liquid, such as water or a combination of water and another liquid, such as a solvent for the foil. For instance, the liquid may in an embodiment comprise a mixture of water with one or more of (iso) propanol and ethanol. Especially, the liquid is chosen such that it is able to (at least partially) dissolve the foil. In a specific embodiment, the foil comprises a liquid soluble material. A foil material that is soluble in water, or an aqueous liquid, may be polyvinyl alcohol (PVA). Hence, in an embodiment the liquid comprises an aqueous liquid, and especially the foil comprises a liquid solvable material. Further, in yet another embodiment the liquid solvable material comprises polyvinyl alcohol.

Further, as indicated above a printed design may be provided. This printed design may especially be used for decorative purposes and/or for providing a supporting layer or structure for the one or more of the electronic wiring and the electronic component. In general, it is this printed design that is transferred to the 3D object, whereas the foil (material) may substantially be dissolved in the liquid. The printed design in immersion printing is known in the art. The printed design is in the art also known as "graphic image". Also this printed design can be substantially artistic, substantially functional, or a combination of both. The printed design may e.g. be printed with a printer. Hence, in embodiments the solid carrier may be flexible. To provide such printed design, especially a printing process may be applied, such as gravure printing, inkjet printing, etc. . . . . . Optionally the printed design may be generated before applying the foil to the support. In yet another embodiment, a printed design is generated to the foil after applying the foil to the support. Hence, in embodiments one or more of the foil provision stage and the electronic provision stage also include providing a printed design to the foil. Optionally, part of the printed design may be generated during the foil provision stage and part of the printed design may be generated during the electronic provision stage. With respect to an embodiment of generating the design during the electronic provision stage, this may include one or more of (i) applying the design before applying the one or more of the electronic wiring and the electronic component to the foil, (ii) applying the design at the same time as applying the one or more of the electronic wiring and the electronic component to the foil, and (iii) applying the design after applying the one or more of the electronic wiring and the electronic component to the foil. Again, it is possible to provide part of the design during an earlier stage and part of the design during a following stage. Hence, in an embodiment, the printed design is generated to the foil after applying the one or more of the electronic wiring and the electronic component to the foil.

Especially, the printed design may substantially be based on acrylic ink. Hence, in embodiments the printed design comprises an acrylic ink, and the liquid soluble material comprises polyvinyl alcohol (PVA). Alternatively or additionally, the printed design may comprise one or more of epoxy-acrylate, urethane-acrylate, and polyester-acrylate, etc. . . . . . Therefore, the printed design is especially based on an acrylic material, such as acrylic ink. Especially, the material of the printed design is substantially not soluble in the liquid. In this way, the printed design can be transferred to the 3D object substantially without the foil (that may dissolve in the liquid).

On the foil (especially including the printed design), the one or more of the electronic wiring and the electronic component are provided. In a specific embodiment, the electronics provision stage comprises printing or coating said electronic wiring on said foil. Instead of or in addition to printing or coating electronic wiring, (also) one or more other technologies may be applied, such as one or more of dispensing, jetting, laminating, etc. . . . . . Suitable materials for such printing or coating include materials that include electrically conductive material and which can be hardened upon one or more of providing heat and/or radiation (including one or more of UV, visible and IR radiation). Alternatively or additionally, drying at ambient temperature may be applied. Suitable electrically conductive materials may e.g. include one or more of silver metal and copper metal, though other options may also be possible.

In a specific embodiment, the liquid immersion transfer process as defined herein may thus (further) comprise applying one or more of a paste, an ink, and a foil strip, wherein the one or more of the paste, the ink and the foil strip comprise one or more of silver comprising curable material and a copper comprising curable material. Hence, such curable material may include material that can be cured by e.g. heat and/or radiation. The electronic wiring may for instance be obtained by one or more of ink jet printing, gravure coating, screen printing, dispensing, etc., the electrically conductive material. In an embodiment, the electrically conductive material is curable by heat, especially at a temperature selected from the range of 50-150° C. The silver comprising material and copper comprising material may e.g. be inks, such as supplied by DuPont, Cabot, Novacentrix (e.g. DuPont CB028, Cabot Ag-IJG-100-S1, Metalon JS-15BP, Metalon ICI-002). Further, silver pastes as silver comprising material may e.g. be supplied by Henkel, Masterbond, Epoxy Technology (e.g. Henkel Eccobond 3103WVL, Masterbond EP21TDCSFL, Epotek ED1003). Note that the hardening or curing may be applied in a single stage process or in a multi-stage process. For instance, it may be beneficial for the strength of the electronic wiring to perform at least a partial curing or hardening of the electrically conductive material. Further, in view of flexibility and transfer, it may be beneficial not to entirely cure or harden the electrically conductive material. Hence, especially a multi-stage process is applied, wherein the electrically conductive material (of the electronic wiring on the foil) is partly cured or hardened before the immersion transfer, and finally cured or hardened after the transfer to the 3D object (see also below). As mentioned above, the curable material may e.g. be a paste. Further, to provide the electrically conductive wiring e.g. silver or nano-silver or nano-copper comprising curable ink or paste, or laminating a copper foil, either patterned before lamination or patterned after lamination, such as by photolithography, may be applied.

In general, first the wiring may be applied and then the electronic component. Optionally, this may be the other way around, or a combination of printing and application (of the electronic component) is applied. To apply the electronic component to the foil, for instance an adhesive may be applied. Especially, this adhesive is (thus) also electrically conductive. This adhesive may be used to attach the electronic component to the foil (and/or printed design). The electronic component may adhere to the adhesive and may in this way be connected to electronic wiring.

Hence, in yet a further embodiment the electronics provision stage comprises dispensing or printing locally an electrically conductive connector material to said foil and arranging said electronic component to said foil, wherein the electrically conductive connector material is configured to functionally connect the electric component and the electronic wiring. As electrically conductive connector material, one or more of an electrically conductive adhesive and a low melting solder material may be chosen. Solder material may comprise solder alloys, which are typically composed of elements such as Sn, In and Bi. An example is e.g. 58Bi42S, having a melting point of 138° C. Especially, the low melting solder may melt in the range of 75-150° C. In an embodiment, dispensing may include forcing a paste with compressed air through a thin needle. Ink may be too thin to be dispensed. Jetting may be more suitable for inks, which may include shooting droplets of e.g. nano silver containing ink to the substrate.

As indicated above, especially a printed design is available before the adhesive and electronic component is provided. Hence, the phrase "arranging said electronic component to said foil" may in fact also imply arranging said electronic component to said foil comprising said printed design. Whatever order is applied, the electronic component may also be associated with the printed design. The printed design (material) may have a function to support the electronic structure provided by the electronic wiring and/or components (and also conductive adhesive), as especially the one or more of the electronic wiring and electronic component are transferred to the 3D object (part) together with the printed design. In yet a further embodiment, the printed design may be configured to provide an optical functionality, such as one or more of light spreading (diffusor functionality), light reflection, local light shielding to provide a lowering of glare, etc. Hence, as indicated herein, the printed design, or part of the printed design, may also be provided at the same time (and/) or after arranging said one or more of the electronic wiring and the electronic component to said foil.

Having applied the electronic wiring and/or electronic component (and electrically conductive adhesive, or solder), the liquid application stage may be commenced. During this stage the solid carrier (when available) may be removed from the foil. This may be done before arranging the foil on or in the liquid. Optionally, the solid carrier may be removed in the liquid. In a specific embodiment, the liquid comprises a solvent for the solid carrier. In general, the solid carrier will be removed before arranging the foil in or on the liquid, as known in the art. Hence, in an embodiment in the liquid immersion transfer process as defined herein, in the liquid application stage first the solid carrier is removed and subsequently the foil is arranged on or in the liquid.

In general, it may be advantageous to soften the (ink comprising) printed design. This may assist in applying the printed design in a smooth way on the 3D object. Such softening may thus allow application of the printed design on the 3D object (substantially) without (undesired) folds. Further, the part of the 3D object to which the electronics and printed design may have to be applied may be pretreated, for instance with an adhesive material for facilitating attachment of one or more of the electronic wiring, the electronic component, and the printed design to said 3D part. For instance, one may apply a primer, such as supplied by HGArts, TWN Industries, etc., to the 3D part. Hence, in an embodiment one or more of the liquid application stage and the transfer stage may further comprise one or more of (i) softening an (ink comprising) printed design (when the printed design (and foil) are on (or in) the liquid) and (ii) pretreating at least part of the 3D object, such as pretreating with a primer. The primer may facilitate attachment of one or more of the electronic wiring, the electronic component, and the printed design to said 3D part.

The foil may be provided to the liquid. Especially, the foil may be arranged on the liquid surface, where it may float. However, optionally the foil may be (partly) submerged. In the latter case, it may still be desirable to configure the foil in such a way that it is substantially horizontal (floating within the liquid).

The one or more of the electronic wiring, the electronic component, and the printed design may especially be applied to the 3D object when at least part of the foil has dissolved in the liquid. The one or more of the electronic wiring, the electronic component, and the printed design may be applied to the 3D object in different ways. The 3D object may be moved from above the liquid (and above the one or more of the electronic wiring, the electronic component, and the printed design), downwards in the liquid, thereby physically touching the one or more of the electronic wiring, the electronic component, and the printed design. Alternatively, the 3D object may be guided in the liquid but circumvent the one or more of the electronic wiring, the electronic component, and the printed design, and approach the one or more of the electronic wiring, the electronic component, and the printed design from below. Especially in the case of electronic wiring and/or electronic components, this latter method may be desired. Such method may more easily keep the electrical component aligned. This may be of relevance for e.g. electrical components having an optical function. Hence, in an embodiment of the process as described herein, in the transfer stage the 3D object is at least partially submerged in the liquid before transfer, and the transfer is effected by moving the 3D object from below the one or more of the electronic wiring and the electronic component (and the printed design) to a position over the liquid.

After removing the 3D object from the liquid, the 3D object with the one or more of the electronic wiring, the electronic component, and the printed design is obtained. Optionally, the 3D object, or at least the part where the one or more of the electronic wiring, the electronic component, and the printed design are applied, may be washed (rinsed) with a solvent for the foil. Such washing may be used to remove at least part of remaining foil material (if any). Further, as indicated below, the electronically conductive material may now be cured or hardened or further cured or hardened. For instance, as indicated above the electrically conductive material may have been partially cured or hardened before the immersion, and may now be finally cured or hardened when arranged on the 3D object. Here, the term "partial curing or hardening" implies that the electronically conductive material is not cured or hardened but is still softer or weaker then when finally hardened. Optionally, this stage may include applying one or more of a further electronic wiring and a further electronic component to the 3D object (part).

Further, optionally also a top coating may be applied to the material applied to the 3D part. Such top coating may improve the integrity and stability of the material provided to the 3D part. Optionally, the top coating may be transmissive to radiation (such as one or more of UV, visible and IR). This may especially be of relevance for an electronic component having an optical function, such as an optical sensor or a light source, etc. In yet a further embodiment, the top coating may be configured to provide an optical functionality, such as one or more of light spreading (diffusor functionality), light reflection, local light shielding to provide a lowering of glare, etc. In still another embodiment the top coating might provide bio-compatible, bio-resistant or bio-degradable properties. This is in particular relevant for devices of the type 'bio-electronic devices' and as used for wearable devices in e.g. healthcare or lifestyle applications.

Hence, in yet a further embodiment subsequent to the transfer stage, the process further comprises one or more of (i) a curing stage, wherein the curing stage comprises curing the electronic wiring, and (ii) a coating stage, wherein the coating stage comprises applying a top coating to at least part of the 3D object comprising said electronics.

The fabrication of an organic odd shaped circuit starting from a 2D layout representation may be quite complex. Therefore limitations will apply, and thus design rules will be required. It is herein suggested to make use of a method that is known as the 'Mercator projection' to translate the 3D requested design into the 2D layout. This 2D layout is the one that is fabricated prior to fluid transfer to the 3D object. Hence, in embodiment the process may further comprise deriving from a virtual 3D model of the (final) 3D object a 2D design of the electronics on the foil and executing the liquid immersion transfer process in conformance with the 2D design. This also allows including openings in the foil to match as good as possible the 3D object (similar to a 3D to 2D conversion of the globe as in the Mercator projections). Hence, the invention also provides a design methodology for reverse designing the planar (2D) substrate and its wiring schemes, such that after transfer to the 3D object a desired final situation is achieved. This might imply folds (so these folds especially do not jeopardize the electrical functionality) or one might apply cuts in the 2D foil such that after transfer to 3D shape again the final envisioned result is achieved.

The invention also provides the 3D object obtainable, such as obtained, with the process of the invention. In a specific embodiment, the invention provides a 3D object comprising an object part, especially a non-flat 3D object part, and a layer structure attached to said (non-flat) 3D object part, wherein the layer structure comprises (i) optionally a top coating, (ii) one or more of electronic wiring and an electronic component, especially electronics comprising said electronic wiring and the electronic component, and (iii) (optionally) a printed design, wherein especially the one or more of electronic wiring and an electronic component, especially the electronics, and the printed design are configured between the (non-flat 3D) object part and the top coating (and wherein the electronics (thus) especially comprise one or more of the electronic wiring and the electronic component, especially said electronic wiring and said electronic component).

As indicated above, the one or more of electronic wiring and an electronic component, especially the electronics, and the printed design are configured between the (non-flat 3D) object part and the top coating. In an embodiment, the one or more of electronic wiring and an electronic component are configured between the printed design and the top coating. In yet another embodiment, the one or more of electronic wiring and an electronic component are at least partially embedded in the printed design.

In yet a further specific embodiment of the 3D object, the (non-flat) 3D object part may (optionally) comprise one or more curvatures. Further, especially the electronic component may comprise one or more of a solid state light source, a sensor, and an electronic solar cell. However, the electronic component may alternatively or additionally also comprise one or more of the other electronic components mentioned herein. Further, especially one or more of the (non-flat) 3D object part and the top coating are transmissive for light. Further, the 3D object may further optionally comprise two or more connectors for electronically connecting the electronics to a power source. Assuming a lighting application, one or more of the object part and the top coating may be transmissive for radiation, especially visible light (see also above). For instance, a (hollow) curved glass body may be used as 3D object. In such embodiment, the light may also be (at least partly) directed into the body, as in general not the entire body will be coated with the herein described process. Of course, a light source may also be configured to provide light with a component in a direction away from the 3D object (part). Alternatively or additionally, the printed design may be transmissive for light.

Hence, in embodiments one or more, especially all of the following features may be included (i) a method for fabricating 2D electronic circuits on a temporary liquid dissolvable film, e.g. Poly Vinyl Alcohol, (ii) a method for transferring 2D electronics to a 3D configuration (3D object), (iii) a carrier element, which defines the overall final shape of the electronics device. The fabrication method for this carrier can be a digital printing based method as this allows making odd shaped product geometries, (iv) standard electronic components, e.g. LEDs, (v) standard electrically conductive ink to make conductive circuitry with state of the art technologies, e.g. inkjet printing, dispensing, etc., (vi) standard electrically conductive connector material to electrically connect the electrical components to the circuitry, (vii) an encapsulation layer that embeds the electronic components.

In yet a further aspect, the invention also provides a system comprising: (i) an electronics applicator configured to apply electronics to a foil in an electronics provision stage, wherein the electronics comprise electronic wiring and an electronic component; (ii) a liquid immersion transfer apparatus configured to transfer the electronics to a 3D object by at least a partial immersion of the 3D object in a liquid in a transfer stage; and (iii) a post-immersion treatment apparatus configured to apply a top coating to at least part of the 3D object. Such apparatus may especially be configured to execute the process as described herein. Similarly, the process as described herein may especially be applied with the apparatus as described herein. The apparatus may further be configured to execute one or more of the herein described specific process embodiments. To that end the apparatus may optionally include one or more additional units, such as selected from a transport unit, a dipping unit, a spraying unit, a curing unit, a drying unit, a washing unit, an alignment unit, a foil cutting unit, etc. . . . . The post-immersion treatment apparatus may optionally further be configured to apply further electronics and/or further wiring to the 3D object.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings are not necessarily on scale.

DETAILED DESCRIPTION

A method is proposed which fabricates 2D electronic circuits on a temporary foil. This foil is partly dissolvable in a specific liquid, e.g. poly vinyl alcohol in water. The foil and the 2D electronic circuits float on the surface of the liquid. When a 3D object is dipped through the foil in to the water, the 2D electronic circuits are transferred to the object. Thus creating a 3D electronic circuit.

A non-limiting embodiment of the process flow is proposed as follows:

1. Start with a liquid dissolvable printed foil, e.g. poly vinyl alcohol;
2. Tape the foil to a rigid carrier;
3. Print circuitry to the foil, e.g. by ink jetting or gravure coating of conductive ink;
4. Sinter ink, e.g. at 120° C. to assure electrical conductivity;
5. Apply conductive adhesive e.g. by dispensing or screen printing;
6. Place electrical components in conductive adhesive;
7. Cure conductive adhesive, e.g. at 120° C. to assure electrical contact;
8. Remove the carrier;
9. Let foil float on liquid surface, e.g. water; circuitry and components, especially facing upwards, water dissolvable layer facing the water;
10. Spray activator (plasticizer in solvent) on to the printed side of the foil to soften the ink;
11. Pre-treat a 3D object to improve adhesion, e.g. by primering (such as e.g. with the commercially available Kunstoff Primer when the object comprises a plastic object part);

12. Dip 3D object through the film in to the water. The print layer with circuitry and components will wrap around and adhere to the 3D object;
13. Rinse off remaining dissolvable polymer at the outside of the 3D object;
14. Let the product dry;
15. Finish the electrical connection by connecting the outer lines with tiny wires; and
16. Optionally apply a clear (light transmissive) top coat, e.g. by spray coating (e.g. spray or dip coat one or more of an acrylic, a urethane, an epoxy, a polyester, and a silicone coating. Such coating may be clear or colored).

Figure 1:
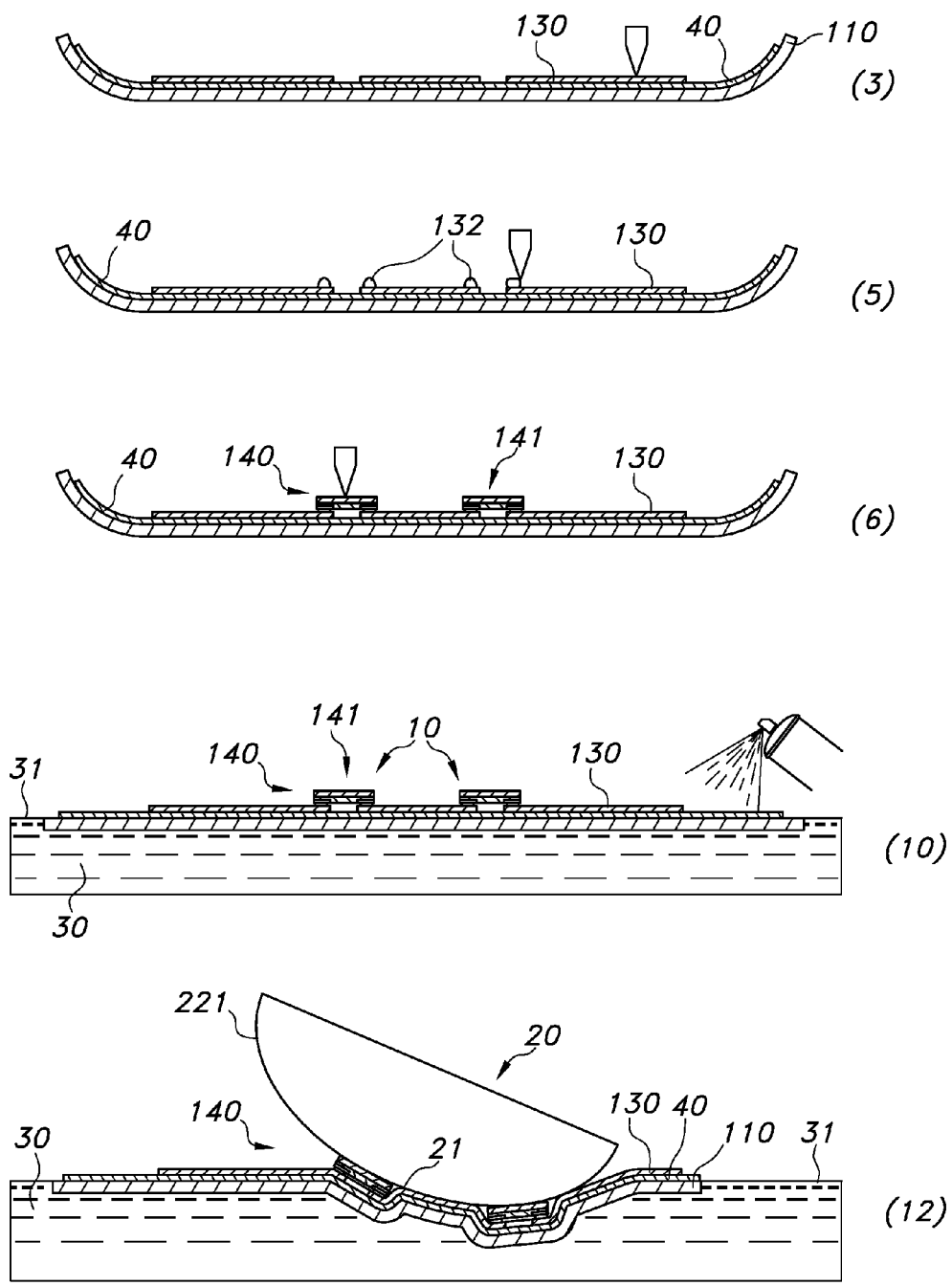
FIG. 1 schematically depicts some stages of the process described herein.

Some of these process stages are shown in FIG. 1. FIG. 1 schematically depicts some of the process stages as indicated above, visually (stage 3) printing circuitry to the foil, e.g. by ink jetting, dispensing or gravure coating, especially ink jetting or dispensing, of conductive ink (such as e.g. Cabot Ag-IJG-100-S1 (nano Ag ink)); (stage 5) applying conductive adhesive (e.g. Henkel Eccobond 3103WVL as silver adhesive paste) e.g. by dispensing or screen printing; (6) placing electrical components in conductive adhesive; (stage 10) spraying activator (plasticizer in solvent, such as e.g. dippdivator from MST-design) on to the printed side of the foil to soften the ink; and (stage 12) dipping 3D object through the film in to the water. The print layer with circuitry and components will wrap around and adhere to the 3D object. This FIG. 1 shows schematically an embodiment of a 3D object 20 having an object part 21 that has one or more curves or curvatures 221, i.e. is non-flat. Further, the figure schematically shows a foil 110 with a printed design 40. Thereon, the wiring 130 is applied. Electrically conductive connector material is indicated with reference 132. The electrical components are indicated with reference 140. By way of example some specific embodiments are indicated in the FIGS. 1; 2B): a solid state light source 141, a sensor 142, an electronic solar cell 143, and an electronic touch button 144. These are only by way of example; the 3D object of the invention may comprise one or more of electronic wiring 130, a solid state light source 141, a sensor 142, an electronic solar cell 143, and an electronic touch button 144. Reference 30 indicates a liquid ("transfer liquid"), for the liquid immersion transfer process, which has a surface 31. Note that in FIG. 1—for the sake of simplicity—the solid carrier has not been depicted (see however FIG. 2a). Note that alternative arrangements and processes may also be possible. As can be derived from the description, not all of the 16 stages indicated above are necessary and/or alternative stages may be introduced. For instance, the electronic component 140 may optionally at least partially be embedded in the printed design 40. The 3D object in FIG. 1 has at least one curvature in this schematic drawing.

In a general embodiment, the process may include e.g. laminating copper (Cu) comprising material, arranging (mounting) the foil (PVA) on a solid carrier (e.g. taping the foil to the carrier), printing conductor to the foil, gluing the electronic component(s) to the foil, primering the 3D object, debonding the carrier, immersion transfer, and rinsing (washing) (to remove at least part of remaining foil (PVA) from the 3D object.

FIG. 1 schematically depicts an embodiment wherein the foil 110 is provided on the liquid 30. Especially, the foil may thus be arranged on the liquid surface 31, where it may float. However, optionally the foil 110 may be (partly) submerged in the liquid 30 (not depicted).

Figure 2A:
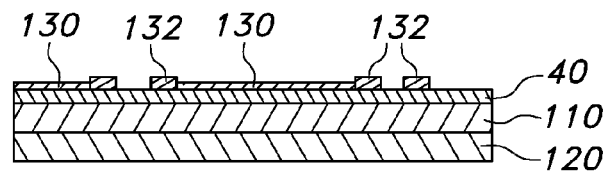
FIGS. 2A and 2B schematically depict some aspects of the invention.
Figure 2B:
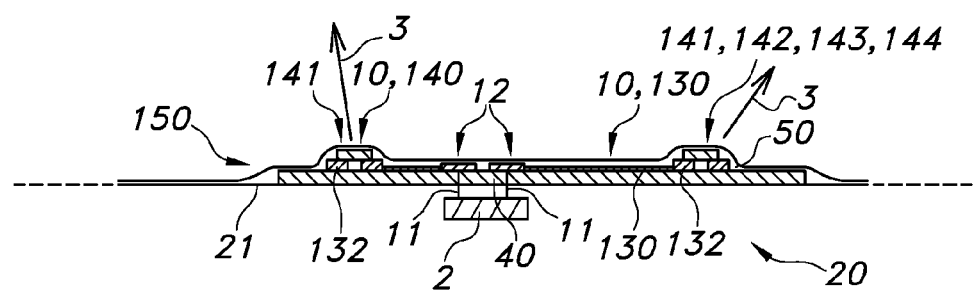

FIGS. 2A and 2B schematically depict some aspects of the invention. FIG. 2A schematically depicts a solid carrier 120 with a layer stack comprising the foil 110 and the gravure or printed design 40. Thereon, the electronics 140 (not depicted) may be provided. By way of example, only electronic wiring 130 and electrically conductive connector material 132 is depicted. This figure may e.g. schematically show a stage before application of an electronic component. An embodiment of a later stage is shown in FIG. 2B, wherein the electronics 10 are applied to the 3D object 20, with object part 21. Here, a layer structure 150 is shown, comprising the printed design 40, wiring 130 and electrical components 140, as well as a top coating 50. By way of example, one of the electronic components comprises a light source 141, and the other schematically depicted component may include one or more of a solid state light source 141, a sensor 142, an electronic solar cell 143, and an electronic touch button 144. Reference 2 indicates an electrical power source for (wireless) powering the electrical component(s) 140. References 11 schematically depict connectors. Alternatively or additionally, reference 12 indicates a device for receiving electrical power via wireless transfer, such as coils (in such instance connectors 11 may not necessarily be present). Top coating 50 may be transmissive for light 3 from e.g. solid state light source(s) 141.

Figure 3:
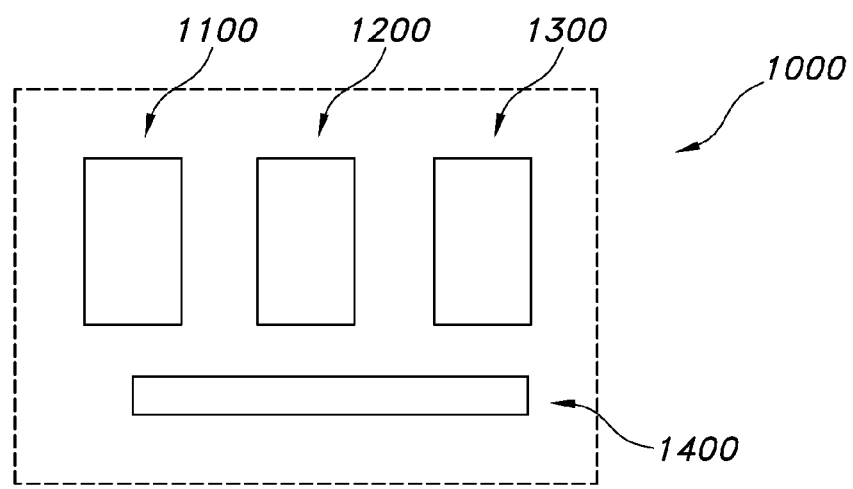
FIG. 3 schematically depicts a system that can be used for the process described herein.

FIG. 3 very schematically depicts a system 1000 comprising an electronics applicator 1100 configured to apply electronics 10 to a foil 110 in an electronics provision stage, wherein the electronics 10 comprise electronic wiring 130 and an electronic component 140; a liquid immersion transfer apparatus 1200 configured to transfer the electronics 10 to a 3D object 20 by at least a partial immersion of the 3D object 20 in a liquid 30 in a transfer stage; and a post-immersion treatment apparatus 1300 configured to apply a top coating 50 to at least part of the 3D object 20. Reference 1400 schematically depicts optional other elements of the system, such as a transporter, a spraying system, a dipping system, etc. However, such elements may also be integrated in one or more of the electronics applicator 1100, the immersion transfer apparatus 1200 and the post-immersion treatment apparatus 1300. The electronics applicator may—amongst others—be configured to provide one or more of electronic wiring and an electronic component to a foil (with optionally a substrate). The immersion transfer apparatus 1200 may—amongst others—be configured to dip the 3D object in the liquid, and remove the 3D object again from the liquid. The post-immersion treatment apparatus may include one or more of a washer, to wash remaining foil away, an option electronics applicator for application of further electronics, a coating device for providing a top coat, etc. etc.

This above process flow was experimentally executed. Amongst others, conductive nano-silver ink tracks were manually dispensed to a commercial printed PVA film. The tracks were sintered at 120° C. The foil was floated on the surface of a water filled container. The edges of the PVA film were taped to avoid curling up. A spherical glass object was pushed through this foil in to the water and thereby transferring the circuitry and the LEDs to the bulb. In another experiment in which circuitry and LEDs were transferred to a primered ABS substrate with half domes with an angle of 20°. The floating foil can be a PVA foil with a digitally printed ink layer. These foils are commonly used for decoration of all sorts of objects using hydro printing. This technique is also called immersion printing, water transfer, hydro graphics or hydro dipping. Instead of water, another solvent can be used in combination with a foil that dissolved in this solvent. The conductive circuitry should be flexible enough to conform to the geometry of the 3D object. Conductive adhesives or inks can be applied by means of dispensing, screen printing or ink jetting. The melting point of the PVA (180° C.) allows curing at elevated temperatures, which increases electrical conductivity of the circuitry. The receiving 3D substrate can be pre-treated with a primer for optical adhesion of the foil stack. Additional bottom layers (e.g. dielectrics can be applied. The 2D circuit can be transferred using fluid assistance. The hydroprinting technology is taken as basis of the approach in this invention. Limitations and design rules will apply for an automated transfer method to potentially very odd shapes. Remaining polyvinyl alcohol and printed ink has to be locally removed in order to connect to the 3D circuit. This can be done by using water and organic solvent. Instead of dipping a 3D object into the water, the object may be lifted from the water basin through the foil. This is advantageous in connecting the circuitry or when e.g. top emitting LEDs are used. A top coat e.g. a clear acrylic varnish can be applied to protect the circuitry and components or to add extra optical functionality, e.g. a diffuse layer.

The fabrication of an organic odd shaped circuit starting from a 2D layout representation is quite complex. Therefore limitations will apply, and thus design rules will be required. We suggest making use of a method that is known as the 'Mercator projection' to translate the 3D requested design into the 2D layout. This 2D layout is the one that is fabricated prior to fluid transfer to the 3D object. This can be part of a digital design methodology, as it allows a final consumer to obtain a personalized lighting product. Based on a set of base elements (building bricks), such as e.g. (1) a set of pre-defined geometry families, (2) LED and electronic parts, (3) circuitry options, a translation of the customers' wish using a digitized method (including design rule checkers) into a final product can be made.

The available materials in the suggested technology are only partly deformable. This means that during transfer the materials (mainly sheet materials) will not fit the new form factor. One approach is to allow folding lines. Another method could be to introduce 'cutting lines'. These cutting lines would ease local folding, or one might even consider cutting out parts of the circuitry layout (carrier material). Alternatively one might consider adapting the technology such that during the fluid transfer no full area materials are remaining (so only metal lines and assembled parts). By doing so a much easier 'folding around' would be achieved, however at the expense of a much more fragile construction.

A number of process and material modifications onto the reference process (as described in embodiment 1) can be envisioned. This might be e.g. one or more of (i) modification of the floating layer such that e.g. that flotation layer (now PVA) remains in the end product; (ii) adding additional layers in the stack, e.g. dielectric layers in non-cured or B-stage status, as to facilitate 'deformation' during transfer from 2D to 3D geometry; (iii) adding extra layers already on the floating stack: e.g. dielectric top or bottom protecting layers, adhesion-facilitating layers (both for adhesion to the 3D geometry as well as receiving layer for a next layer of circuit; (iv) the same consideration as above can be made for the conductor lines; if these can be constructed 'stretchable', either by material choice or by design (with meander shapes) or both, then also easier transfer (or more complex shapes) become plausible; (v) hydrofoil printing typically uses PVA on water method. For reasons of e.g. better floating, optimized process times, optimized mechanical conditions, etc. one can consider using other material choices, e.g. based on a combination of an organic fluid carrier and an inorganic floating layer.

Contacting a transferred circuit might be realized in a number of ways. Obviously one might consider applying (in an assembly process) e.g. a kind of standardized connector onto the conductor layer. Or any other method might be applied. However we suggest using a more dedicated method: a special method would be to combine (1) a conductor layer extension (kind of fan-out structure) of the transferred conductor layer with (2) pre-applied electrical interfaces (e.g. metal pins) that are already present on/in the 3D lighting device carrier. During the circuit transfer the conductor layer extension areas are to overlap the electrical interfaces, after which (if one does not achieve an ohmic contact by itself) a permanent ohmic contact can be made by e.g. a local heating step, a laser welding step, the applying of a conductive glue droplet, etc.

In addition to or alternative to LEDs or LED packages, also other application may be possible, such as active switches, storage elements, etc.

In general, the transfer of a single layer circuit was described. However one might consider running a number of consecutive transfer processes, as to obtain a multi-layer circuit. Obviously this will further allow more complex and hence more application-specific solutions. These multiple layers can be 'same kind of layers' or these might be stacked with a specific purpose; e.g. the bottom layer(s) might be electrical supply/power and intelligence, while the top layer might be the LED-containing layer. One may have to implement obviously electrical vertical connections between these layers. We consider two possible approaches here. The first can make use of the earlier discussed 'added interfaces with pins', in which case the pins would protrude through extended fan-out areas of the multiple layers and next permanent ohmic contacts would be established at that location. A second method would be to make (e.g. by laser) contact points between the stacked layers via e.g. a kind of melt or fusion reaction.

In yet another embodiment it is suggested, for the case of very complex shapes, to apply multiple transfers of layers that are now not overlapping (unless partly, for realizing layer-to-layer electrical connections). A kind of stitching method is thus proposed, in which 'strips' of transfer foils would be 'draped' around the 3D structure, as to allow maximal coverage with lighting functionality. The strips of circuitry can be electrical connected to each other with one of the above suggested methods (so typically requiring at least at the location of the electrical connection overlapping layers).

The invention claimed is:

1. A liquid immersion transfer process for applying electronics on a 3D object, the process comprising:
providing a foil on a solid carrier in a foil provision stage;
providing electronic wiring and an electronic component to the foil in an electronics provision stage, to provide said electronics;
removing the solid carrier and arranging the foil on or in a liquid in a liquid application stage;
transferring the electronics to the 3D object in a transfer stage.

2. The liquid immersion transfer process according to claim 1, wherein the liquid comprises an aqueous liquid, and wherein the foil comprises a liquid soluble material.

3. The liquid immersion transfer process according to claim 1, wherein one or more of the foil provision stage and the electronics provision stage also include providing a printed design to the foil.

4. The liquid immersion transfer process according to claim 3, wherein the printed design comprises an acrylic ink.

5. The liquid immersion transfer process according to claim 1, wherein the electronics provision stage comprises printing or coating said electronic wiring on said foil.

6. The liquid immersion transfer process according to claim 5, comprising applying one or more of a paste, an ink, and a foil strip, wherein the one or more of the paste, the ink and the foil strip comprise one or more of silver comprising curable material and copper comprising curable material.

7. The liquid immersion transfer process according to claim 1, wherein the electronics provision stage comprises dispensing or printing locally an electrically conductive connector material to said foil and arranging said electronic component to said foil, wherein the electrically conductive connector material is configured to functionally connect the electric component and the electronic wiring, and wherein the electrically conductive material comprises an electrically conductive adhesive.

8. The liquid immersion transfer process according to claim 1, wherein one or more of the liquid application stage and the transfer stage further comprise one or more of (i) softening an ink comprising printed design and (ii) pretreating at least part of the 3D object.

9. The liquid immersion transfer process according to claim 1, wherein in the transfer stage the 3D object is at least partially submerged in the liquid before transfer.

10. The liquid immersion transfer process according to claim 1, wherein subsequent to the transfer stage, the process further comprises one or more of (i) a curing stage, wherein the curing stage comprises curing the electronic wiring, and (ii) a coating stage, wherein the coating stage comprises applying a top coating to at least part of the 3D object comprising said electronics.

11. The liquid immersion transfer process according to claim 1, wherein the electronic component comprises one or more of a solid state light source, a sensor, an electronic solar cell, and an electronic touch button.

12. The liquid immersion transfer process according to claim 1, the process further comprising deriving from a surface of a virtual 3D model of the final 3D object a 2D design of the electronics on the foil and executing the liquid immersion transfer process in conformance with the 2D design.

13. The liquid immersion transfer process according to claim 2, wherein the liquid soluble material comprises polyvinyl alcohol (PVA).

* * * * *